(12) United States Patent
Rossing et al.

(10) Patent No.: US 7,046,331 B2
(45) Date of Patent: May 16, 2006

(54) LITHOGRAPHIC APPARATUS, DEVICE MANUFACTURING METHOD, AND DEVICE MANUFACTURED THEREBY

(75) Inventors: Harm Roelof Rossing, Nijmegen (NL); Marinus Aart Van Den Brink, Moergestel (NL); Richard Alexander George, Son en Breugel (NL)

(73) Assignee: ASML Netherlands B.V., Veldhoven (NL)

( * ) Notice: Subject to any disclaimer, the term of this patent is extended or adjusted under 35 U.S.C. 154(b) by 295 days.

(21) Appl. No.: 10/407,944

(22) Filed: Apr. 7, 2003

(65) Prior Publication Data
US 2003/0211297 A1    Nov. 13, 2003

(30) Foreign Application Priority Data
Apr. 9, 2002    (EP) .................................. 02252526

(51) Int. Cl.
*G03B 27/32*    (2006.01)
*G03B 27/42*    (2006.01)
(52) U.S. Cl. ......................................... 355/53; 355/77
(58) Field of Classification Search ................ 355/53, 355/55, 67–71, 77, 72, 75
See application file for complete search history.

(56) References Cited

U.S. PATENT DOCUMENTS

| 5,793,052 | A | 8/1998 | Kawaguchi | |
|---|---|---|---|---|
| 6,266,144 | B1 | 7/2001 | Li | |
| 6,327,022 | B1 * | 12/2001 | Nishi | 355/53 |
| 6,417,914 | B1 * | 7/2002 | Li | 355/75 |
| 6,426,790 | B1 * | 7/2002 | Hayashi | 355/72 |
| 6,549,269 | B1 * | 4/2003 | Nishi et al. | 355/53 |
| 6,590,636 | B1 * | 7/2003 | Nishi | 355/53 |
| 6,788,385 | B1 * | 9/2004 | Tanaka et al. | 355/53 |
| 6,876,439 | B1 * | 4/2005 | Galburt et al. | 355/77 |

FOREIGN PATENT DOCUMENTS

WO    WO01/40875    6/2001

* cited by examiner

*Primary Examiner*—Rodney Fuller
(74) *Attorney, Agent, or Firm*—Pillsbury Winthrop Shaw Pittman, LLP

(57) ABSTRACT

A lithographic projection apparatus having at least two substrate holders is controlled to reduce effects of differences in images caused by differences between the two substrate holders. The apparatus includes an internal or external detector that identifies a substrate and associates it with a respective one of the substrate holders. A controller ensures that either the substrate is processed on the appropriate holder or that correction is applied to the imaging. In an alternate embodiment, the substrate is associated with a respective one of the substrate holders and is consistently processed using that substrate holder without further identification steps.

25 Claims, 3 Drawing Sheets

LITHOGRAPHIC APPARATUS, DEVICE MANUFACTURING METHOD, AND DEVICE MANUFACTURED THEREBY

This application claims priority to European Application 02252526.5, filed Apr. 9, 2002, the entire contents of which are incorporated by reference.

BACKGROUND OF THE INVENTION

1. Field of the Invention

The present invention relates to a lithographic projection apparatus, a device manufacturing method and a device manufactured thereby.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptic systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

The inventors have investigated performance of multistage lithographic apparatus and have determined that there may be performance problems with imaging a single substrate in steps performed on the different stages (substrate holders) within the same machine. For example, the inventors have determined that one component of overlay error is an error between stages. In experiments, this error component was determined to be on the order of 1–10 nm, even for very precisely matched stages. As requirements for overlay performance increase, eliminating an error of even a few nanometers may be exceptionally valuable.

SUMMARY OF THE INVENTION

It is an aspect of the present invention to allow improved image performance in lithographic processes using multistage lithography apparatus.

This and other aspects are achieved according to the invention in a lithographic apparatus including apparatus a radiation system constructed and arranged to provide a beam of radiation; a support constructed and arranged to support a patterning device, the patterning device constructed and arranged to pattern the beam of radiation according to a desired pattern; a first substrate holder constructed and arranged to hold a substrate; a second substrate holder constructed and arranged to hold a substrate; a projection system constructed and arranged to project the patterned beam of radiation onto a target portion of the substrate; and a controller that controls the apparatus such that when imaging a second pattern onto a substrate having a first pattern imaged thereon effects of differences between the two substrate holders are reduced.

By accounting for differences between the substrate holders, the apparatus according to the present invention can achieve improved imaging performance. The inventors have been able to achieve overlay performance improvement of several nanometers. Manufacture of stages giving this level of stage to stage overlay performance would be extremely costly, if it were possible at all. Thus, the present invention allows increased performance without additional engineering and manufacturing expenses.

The controller may ensure that a substrate on which a first pattern has been imaged will be imaged with a second pattern using the same substrate holder. That is, for each substrate, critical process steps will be performed on the same substrate holder.

Alternately, the controller may adjust imaging to account for differences between the two substrate holders.

According to a further aspect of the invention there is provided a device manufacturing method including projecting a patterned beam of radiation onto a target portion of a layer of radiation-sensitive material at least partially covering a substrate; providing a first and second substrate holder to hold the substrate during imaging; controlling the imaging of a second pattern onto a substrate containing a first pattern to reduce effects of difference between the two substrate holders.

The controlling of the imaging may comprise, for example, ensuring that the second pattern is imaged onto the substrate while it is held on the one of the two substrate holders on which it was held during imaging of the first pattern.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
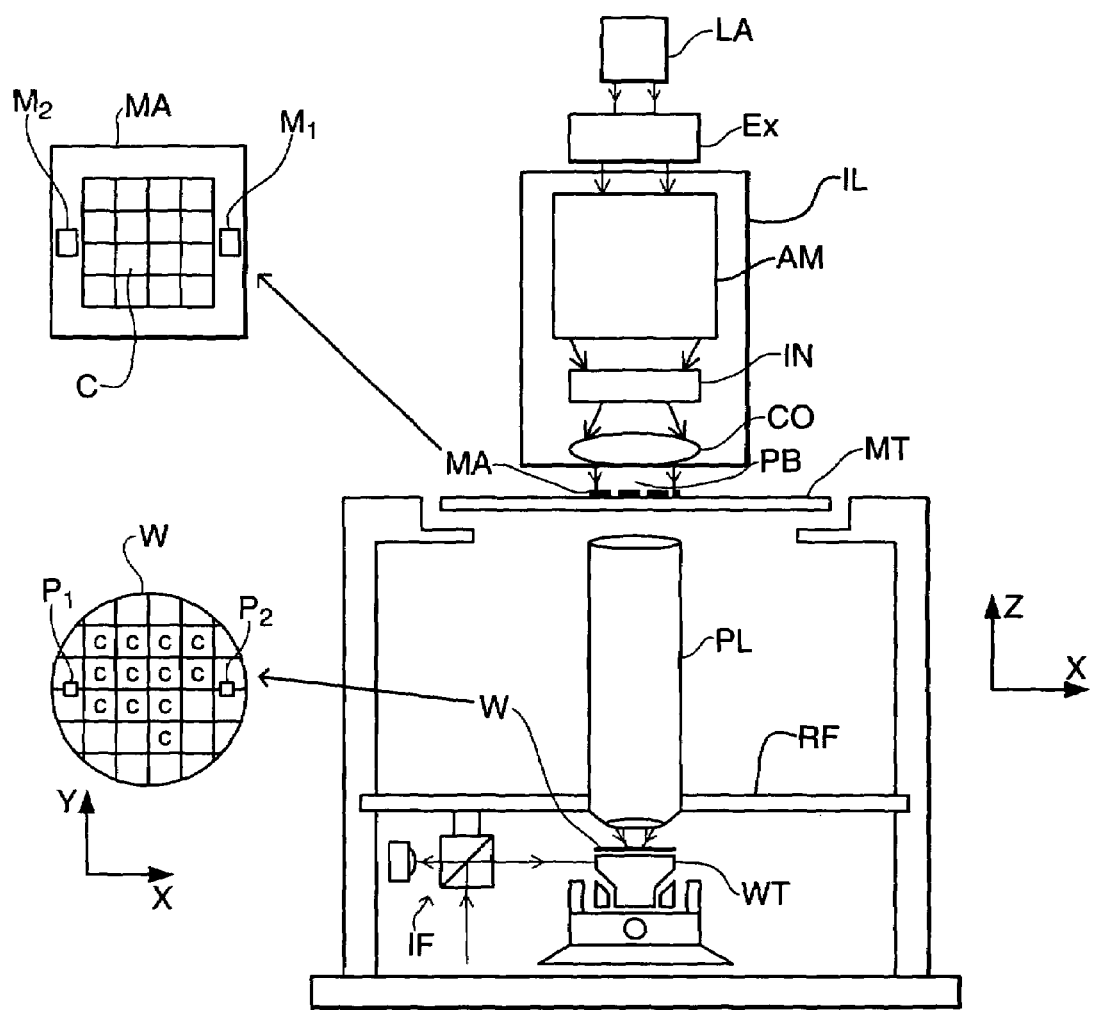
FIG. 1 depicts a lithographic projection apparatus according to an embodiment of the invention.

FIG. 1 schematically depicts a lithographic projection apparatus 1 according to an embodiment of the invention. The apparatus includes a radiation system Ex, IL constructed and arranged to supply a beam PB of radiation (e.g. UV or EUV radiation, such as, for example, generated by an excimer laser operating at a wavelength of 248 nm, 193 nm or 157 nm, or by a laser-fired plasma source operating at 13.6 nm). In This embodiment, the radiation system also comprises a radiation source LA. The apparatus also includes a first object (mask) table MT provided with a mask bolder constructed and arranged to hold a mask MA (e.g. a reticle), and connected to a first positioning device PM to accurately position the mask with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable minor array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a projection beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g. the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
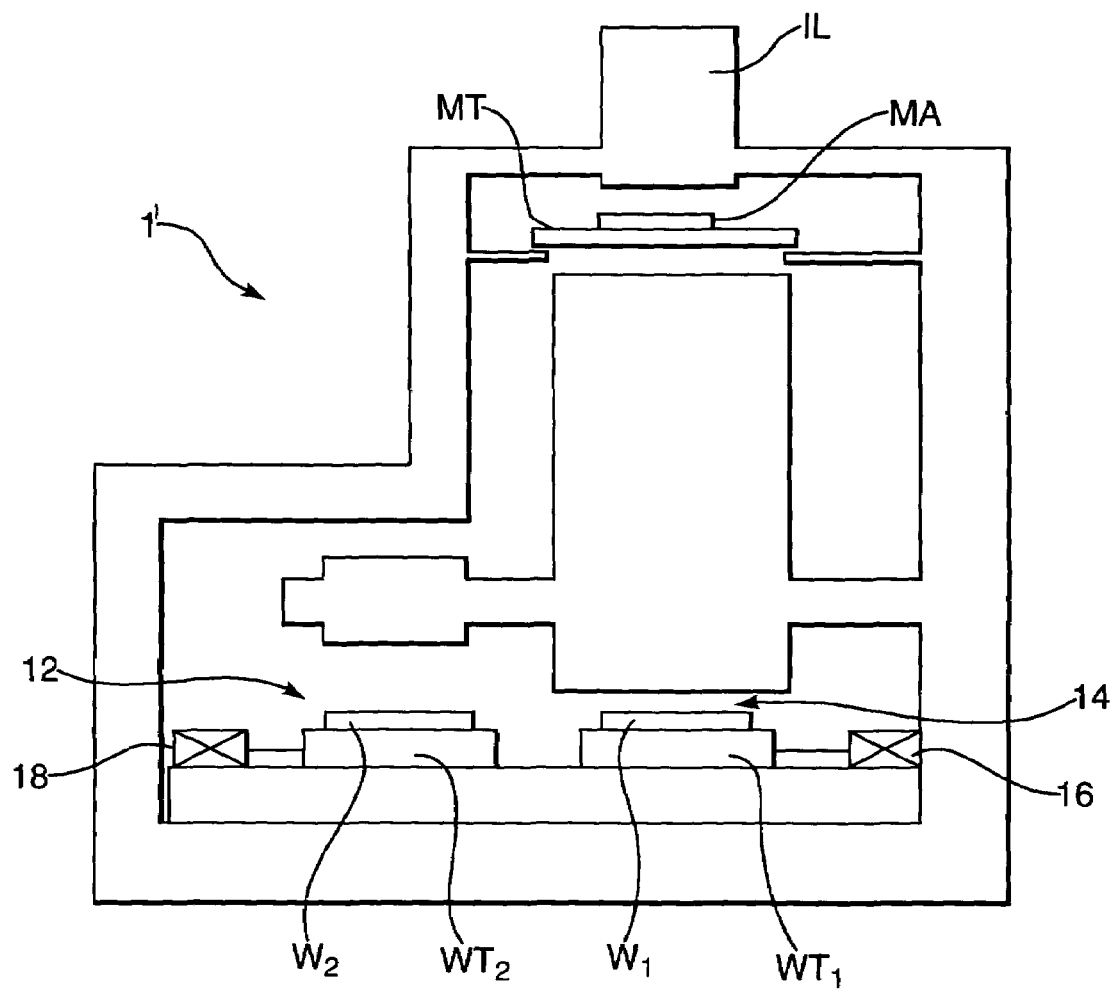
FIG. 2 is a schematic diagram of a dual stage lithographic projection apparatus according to an embodiment of the invention.

FIG. 2 illustrates an embodiment of a lithographic projection apparatus 1' having two substrate holders in accordance with the present invention. It will be appreciated that certain systems have been simplified as compared to FIG. 1, while others are shown with additional details. Those parts of the two substrate holder system that are similar to those of the apparatus 1 of FIG. 1 are identified with the same reference characters. Because the apparatus depicted in FIG. 2 includes two substrate holders and two substrates, these are indicated with subscripts as $WT_1$, $WT_2$, $W_1$, and $W_2$, respectively.

As shown in FIG. 2, the mask table MT is configured to be movable for scanning as described above. It is however contemplated that, as with the single stage apparatus of FIG. 1, the dual-stage apparatus of FIG. 2 may be operated either in step mode or in step-and-scan mode.

The apparatus 1' further includes a characterization unit 10 that may be used to provide characterization of one substrate $W_2$ at a characterization position 12 while the other substrate W is in an imaging position 14. The characterization unit 10 is used, for example, to measure various characteristics of the substrate $W_2$ such as local unflatness and die locations, and to align the substrate $W_2$ to its respective substrate holder $WT_2$. By carrying out imaging on substrate W1 while characterizing the other substrate $W_2$, total throughput may be increased.

Each substrate holder $WT_1$, $WT_2$ is shown as having a respective actuator 16, 18 for moving the substrate holder $WT_1$, $WT_2$ during operation of the apparatus 1'. In one embodiment, the two actuators 16, 18 move the substrate holders $WT_1$, $WT_2$ within the imaging position and the characterization position, and interact to hand-off the substrate holders from one to the other. The substrates remain on their respective substrate holders during both characterization and imaging so that the characterization information remains valid during imaging.

In a batch process, several substrates are introduced into the apparatus in series. A first substrate W1, after being characterized at the characterization position 12, is moved to the imaging position 14 for imaging. During imaging of the first substrate $W_1$, a second substrate $W_2$ is characterized at the characterization position 12. This series of operations continues for an arbitrary number of substrates.

After the entire batch is imaged, the substrates are typically further processed. For example, the resist is developed and etched, then metallization or dielectric layers, for example, are applied to the substrate. Next, a new layer of resist is applied and a second (or subsequent) pattern is imaged onto the substrates. If a specific effort is not made, it is possible that the first substrate $W_1$ will enter the apparatus and be carried on the second substrate holder $WT_2$. Likewise, when the first substrate W1 moves to the imaging position 14, the second substrate $W_2$ may enter the apparatus 1' and be carried on the first substrate holder $WT_1$. Thus, each substrate will end up being characterized and imaged while supported by a holder different from the one that supported it during the first imaging process.

Because the two substrate holders may not be exactly alike, some degree of error may be introduced into each of the characterization and imaging processes. Overall, these errors can cause error in image overlay between a first and second (or subsequent) imaging process. Furthermore, in a typical chip manufacturing process, there may be 20 or more layers imaged. It is possible that certain of these layers are imaged on one holder and certain of the others are imaged on the other holder. Therefore, there may not be any guarantee that any particular layers will have optimal overlay relative to any other particular layers.

In accordance with an embodiment of the present invention, the projection apparatus 1' includes a controller that reduces effects of differences between the two substrate holders. The controller ensures that each substrate is processed on a respective one of the substrate holders $WT_1$ or $WT_2$ for each lithographic processing step. Alternately, in the case that overlay is not crucial between all layers, the controller ensures that each substrate is processed on a respective one of the substrate holders for each layer that is determined to be a "critical" layer, wherein the peak performance is required.

Figure 3:
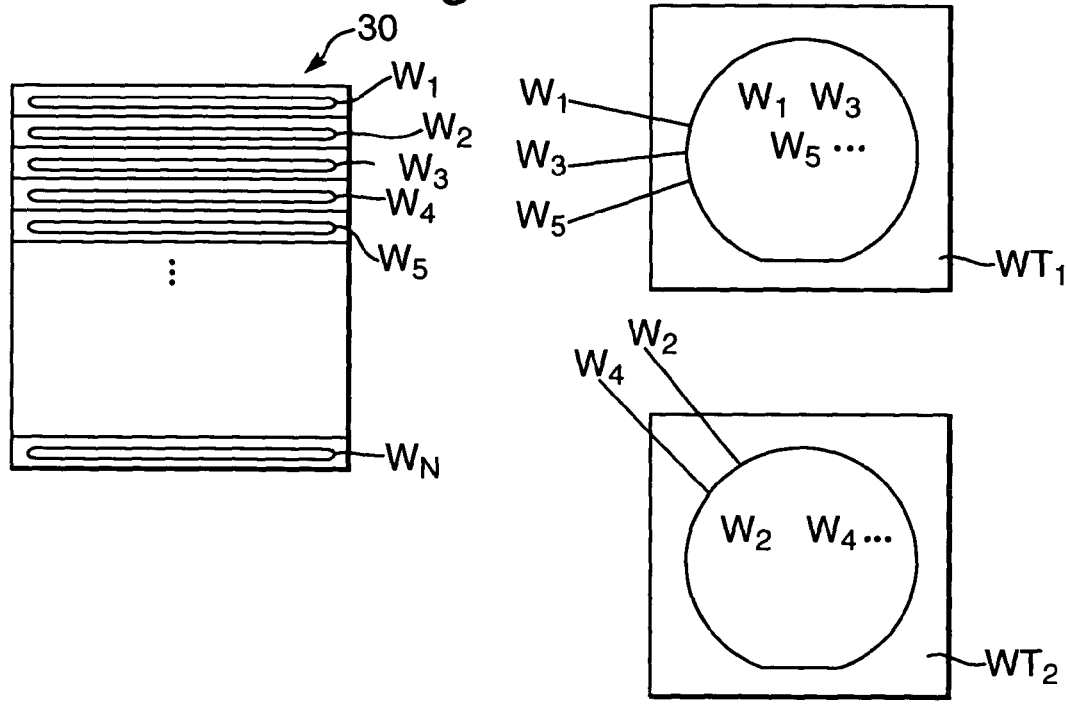
FIG. 3 is a schematic diagram showing a ordered substrate batch for use in accordance with an embodiment of the invention.

One manner in which the apparatus 1' can ensure that a particular substrate is processed on a particular substrate holder is to include a substrate cassette 30, or other storage structure, in which a plurality of substrates may be stored for processing, as shown in FIG. 3. The substrate cassette 30 contains the substrates in a predetermined order such that, for example, the first substrate W1 will always be processed first, and the second substrate $W_2$ will always be processed second, and so on for substrates through $W_N$. It can be appreciated that as long as the order of the substrates is maintained in a known manner, each substrate can always be matched to its respective substrate holder for processing. By way of example, the cassette may include a series of substrates, $W_1$, $W_2$, $W_3$, $W_4$, $W_5$, . . . $W_N$ to be processed. Each odd numbered substrate is then processed on the first substrate holder $WT_1$ and each even numbered substrate is processed on the second substrate holder $WT_2$. In subsequent imaging processes, as long as the even and odd substrates are alternated, the appropriate substrate may be matched to its respective holder. As is apparent, the use of a particular storage structure is not required, but rather a variety of methods of maintaining a known order of the substrates may be employed.

In lieu of physically alternating the substrates, a handling arm or arms of the lithographic apparatus 1' can be programmed to select the appropriate substrate from a storage location in any order necessary to maintain a relationship between the holders and the substrates. In this case, it may be preferred to allow a user to identify in advance which substrate holder will be used to process each substrate. This may be performed as part of the batch definition or as part of a set-up procedure via, for example, an administration system which may be a computer control system for a fabrication facility comprising one or more lithographic projection apparatus together with track and thermal processing apparatus.

It is often the case that, following exposure, processing of substrates is sequential. In other words, each step of the processing operates in a first in first out manner such that following processing the substrates will be in the same order $W_1$, $W_2$, $W_3$, $W_4$, $W_5$ . . . . , $W_N$ that they were in immediately after exposure. Where it is known that processing steps applied to a batch of substrates are sequential, then a storage structure as described above may not be required. The order of the substrates remains intact as a direct result of the sequential processing. The substrates may be returned to the lithographic projection apparatus without being held in storage (i.e. immediately after processing), or may be held in a conventional storage structure (provided that the order of the substrates is not altered by the storage structure). When the substrates are returned to the lithographic projection apparatus it is required that the first substrate be passed to the correct substrate holder WT. Provided that this is done all subsequent substrates will be passed to the correct substrate holder WT. There are several methods whereby the correct substrate holder may be identified for the first substrate. For example, the lithographic projection apparatus may be configured such that the first substrate of every batch is processed on the first substrate holder WT. This would mean that whenever a batch is returned to the lithographic projection apparatus, the first substrate of the batch is again processed on the first substrate holder WT. In an alternative method, information regarding each batch may be retained following an exposure, and then retrieved when the batch is returned to the lithographic projection apparatus. The information may comprise a batch identifier together with a record of the first substrate holder used for the batch, and may for example be retained at the lithographic projection apparatus. Where this is done the administration system may track the location of the batch and notify the lithographic projection apparatus of the identity of the batch when it is returned to the lithographic projection apparatus. The identity of the batch is used, with the information retained at the lithographic projection apparatus, to determine the substrate holder to which the first substrate of the batch should be passed. In a further alternative method, the batch identifier together with a record of the first substrate holder used for the batch may be retained by the administration system, and when the batch is returned to the lithographic projection apparatus, the administration system may use this to instruct the lithographic projection apparatus to pass the first substrate to the correct substrate holder.

In the above described embodiments of the invention, there is some reliance upon the sequence in which substrates pass to the lithographic projection apparatus being unaltered. There may be some instances in which the sequence could be altered, for example if a defective substrate is identified during substrate inspection. In conventional lithographic processing a defective substrate would be removed, thereby modifying the sequence and preventing correct functioning of the embodiment of the invention. This problem may be solved in several ways. For example, the defective substrate may be retained in its place in the batch; that is it is processed as normal and is removed once all lithographic processes have been completed (i.e. all layers have been exposed). Alternatively, the defective substrate may be taken out and replaced by a dummy substrate. In a third alternative method, the substrate may be removed in the conventional way, but with a record being retained of which substrate was removed from the sequence. This record is used by the lithographic projection apparatus, either directly or via instructions from the administration system, to modify accordingly the sequence in which the substrate holders are used. In a further alternative method, when a substrate from a batch is removed from the sequence, the remaining substrates can be re-ordered so as to maintain the proper relationship between the substrates and the substrate holders.

Figure 4:
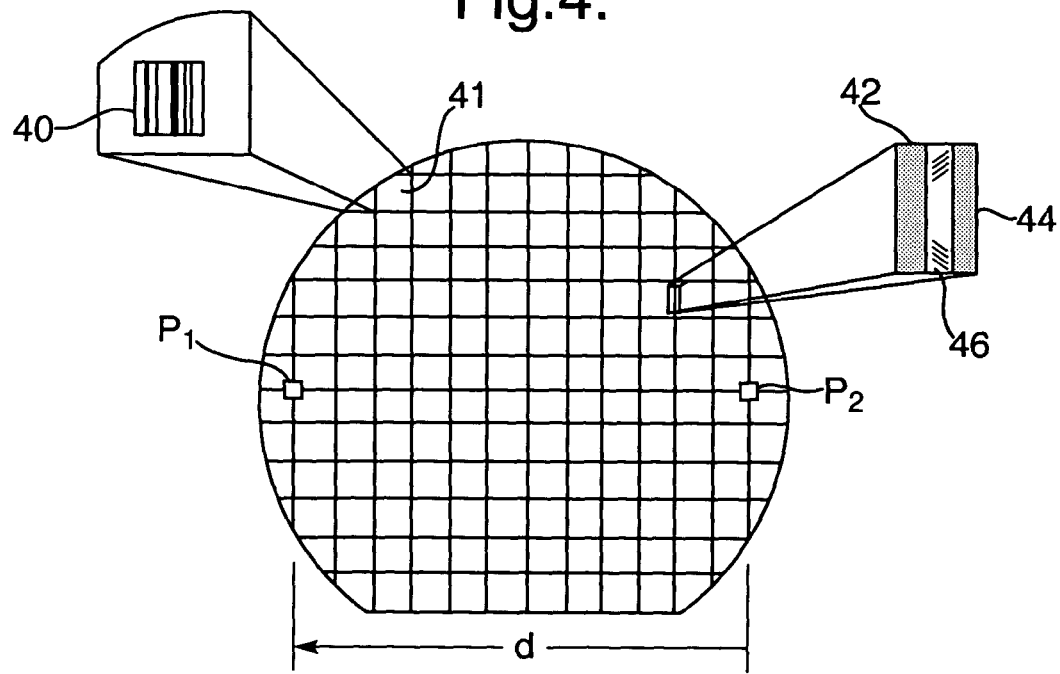
FIG. 4 is a schematic diagram illustrating a wafer having identification markings in accordance with embodiments of the invention.

In an alternate embodiment, each substrate has an identification mark thereon. FIG. 4 illustrates some alternative markings that may be used to identify a substrate. The illustrated markings are not exhaustive and a variety of identification markings could be employed. A bar code or another machine-readable code 40 can be printed onto the substrate as shown in FIG. 4. In the illustrated example, the code 40 is printed onto a die 41 that will not be used because it will not be completely imaged. A complete die could be used, though this may not be preferred due to the wasted substrate. The code 40 may simply include information indicating to what substrate holder this substrate is assigned, or it may include additional information such as a machine identifier, a batch number, a process type or any other information that might be desirable to associate with the substrate.

The code may be a substrate identification code written as a series of characters which may be recognized using an appropriate detector and optical character recognition software. The detector may be located externally of the lithographic projection apparatus, for example in a track adjacent to the apparatus, with the substrate identification code being determined and then passed to the lithographic projection apparatus to allow the apparatus to select the appropriate substrate holder for that substrate. The lithographic projection apparatus selects the appropriate substrate holder using records retained at the apparatus which indicate which substrate holder was used previously for that substrate. Alternatively, the necessary records may be retained by the system administrator which, upon receiving the substrate identification code, determines the appropriate substrate holder and issues instructions to the lithographic projection apparatus accordingly.

One alternative location for a code is in the space between two dies 42, 44. In a typical lithographic process, dies are separated by lines, called scribe lines, that do not contain portions of the chips being patterned. Within the space of the scribe lines, various alignment marks 46 are sometimes imaged for use in controlling the lithographic process. It is contemplated that this space could be used to insert a code 40 as previously described.

Codes which may be read using an alignment detector of the lithographic projection apparatus are advantageous because they allow the information regarding the substrate to be determined internally within the lithographic projection apparatus, instead of relying on external input from, for example, a track or a system administrator. It will be appreciated that a suitable dedicated detector may be provided within the lithographic projection apparatus (as described below).

In another embodiment, the alignment marks $P_1$ and $P_2$ are encoded with the identification information. For example, the distance between the marks d can be changed such that the appropriate substrate holder may be identified. Thus, for a distance $d_1$, the apparatus can determine that the substrate should be processed on the first substrate holder $WT_1$, while for a different distance $d_2$ the apparatus determines that the substrate should be processed on the second substrate holder $WT_2$. It is contemplated by the inventors that the amount of change in position in the alignment marks will in some cases be limited by the requirements of the machine. For example, in certain machines the alignment system has a limited "capture range" within which it will detect the marks. Thus, for such a system, the marks should be shifted by less than the capture range. Moreover, because alignment marks normally have some variation in position and because there is often some variation in detected position, the marks should be shifted by more than the expected level of uncertainty of the alignment measurements. By way of example, the shift may be in the range of a few microns (e.g. 1–2 μm).

Additionally, other alignment features could be used to identify a wafer. For example, a distance between parts of a single alignment mark or between a particular part of one alignment mark and a corresponding part of another alignment mark could be used. By way of example, in the case that an alignment mark incorporates a grating, the grating spacing could be altered to allow association of a substrate with a particular substrate holder selected from a plurality of substrate holders.

For the foregoing embodiments using identification information encoded onto the substrate, the lithographic apparatus may incorporate an appropriate detector. Some examples include a separate bar code reading system, a video camera, microscope, or the alignment system. The detector may be incorporated into other parts of the apparatus such as the imaging system (e.g., illumination and/or projection system), the characterization unit (e.g., alignment system) or in another system that inspects the substrate prior to its entry into the lithographic apparatus. Other detectors may be appropriate depending on the type of identification information used.

It will be appreciated that, if it is known that the sequence of the substrates has not been altered during processing or storage, then it is necessary only to identify the first substrate of the batch, subsequent substrates will automatically be processed using the appropriate holder. Similarly, if the sequence of the substrates has been modified in a known way, then it is again necessary only to identify the first substrate of the batch. If the sequence of the substrates is entirely unknown then each substrate must be identified individually.

It will be appreciated that the term "identified" may mean that a unique identity for each substrate is determined, or may simply mean that the appropriate substrate holder for each substrate is determined.

In operation of a particular embodiment, an arbitrary substrate is selected for processing. The selected substrate is identified to determine which is the appropriate substrate holder. Next, the identified substrate may be moved to the appropriate substrate holder and processed. In the case where the identification is made while the substrate is already mounted on a holder (such as when the characterization unit is used to identify the substrate), it may already be on the correct holder. In this case, the substrate is not moved, but is processed directly.

Alternatively, the identified substrate may be processed on the other substrate holder, that is, the holder that has not processed it in the past. In this case, imaging correction is applied to the imaging in order to reduce the effects of differences between the substrate holders.

Imaging correction may comprise a variety of techniques as understood by one of ordinary skill in the art. For example, it may be possible to characterize the overlay problems observed between a given pair of substrate holders. That is, it is possible that there is a set of positional vectors that can be determined that, if applied to an image made on one substrate holder would produce the same image as would have been made on the other substrate holder. In the case that such a relationship can be determined, the imaging process can be modified in order to reduce the effects of the differences. In one embodiment, a vector map or other characteristic difference information can be stored in a memory of the lithographic apparatus and used during processing of subsequent layers on the substrate.

In certain cases, the positional relationship between an interferometer mirror of a substrate holder and the substrate carried thereon is different between substrate holders. This may result from errors in positioning of the mirror, errors in positioning of a gripper portion of the holder (such as a pimple table), or the like. In this case, a positional or rotational difference will be perceived when a given substrate is held on the two different substrate holders. Since this reflects a physical error that is relatively consistent, appropriate corrections can be applied. Similarly, if there is a relative unflatness or tilt between the two substrate holders, appropriate programming of the imaging operation may successfully reduce overlay errors.

Although the invention has been described in relation to a lithographic apparatus having two substrate holders, it will be appreciated that the invention may be applied to a lithographic apparatus having any number of substrate holders (i.e. any number except 1).

While specific embodiments of the invention have been described above, it will be appreciated that the invention may be practiced otherwise than as described. The description is not intended to limit the invention.

What is claimed is:

1. A lithographic projection apparatus, comprising:
   a radiation system constructed and arranged to provide a beam of radiation;
   a support constructed and arranged to support a patterning device, the patterning device constructed and arranged to pattern the beam of radiation according to a desired pattern;
   a first substrate holder constructed and arranged to hold a substrate;
   a second substrate holder constructed and arranged to hold a substrate;
   a projection system constructed and arranged to project the patterned beam of radiation onto a target portion of the substrate; and
   a controller that controls the apparatus such that, when imaging a second pattern onto a substrate having a first pattern imaged thereon, effects of differences between the two substrate holders are reduced, wherein the controller ensures that a substrate on which the first pattern is imaged will be imaged with the second pattern using the same one of the two substrate holders.

2. An apparatus as in claim 1, wherein, during use, one substrate of a plurality of substrates is imaged while held by the first substrate holder and another substrate of the plurality of substrates is held by the second substrate holder.

3. An apparatus as in claim 1, wherein the controller adjusts the imaging to account for differences between the substrate holders.

4. An apparatus as in claim 1, further comprising a detector constructed and arranged to inspect a substrate to determine substrate identification information prior to imaging.

5. An apparatus as in claim 4, wherein the detector comprises an alignment system of the apparatus.

6. An apparatus as in claim 4, wherein the detector comprises at least one of a bar code reader, a machine vision system, a video camera, a microscope and combinations thereof.

7. An apparatus as in claim 4, wherein the detector is external of the lithographic projection apparatus.

8. An apparatus as in 4, wherein the substrate identification information comprises information regarding the first substrate of a batch of substrates.

9. An apparatus as in claim 1, further comprising a storage device configured to store substrate identification information together with associated substrate holder information.

10. An apparatus as in claim 1, wherein the controller indicates which substrate holder must be used when imaging the second pattern onto the substrate or adjusts the imaging to account for differences between the substrate holders.

11. A device manufacturing method, comprising:
    projecting a patterned beam of radiation onto a target portion of a layer of radiation-sensitive material at least partially covering a substrate to image a first pattern;
    providing a first and second substrate holder to hold the substrate during imaging;
    imaging a second pattern onto the substrate; and
    controlling the imaging of the second pattern to reduce effects of differences between the two substrate holders, wherein controlling comprises ensuring that the second pattern is imaged onto the substrate while the substrate is held on the first substrate holder.

12. A method as in claim 11, further comprising:
    imaging a first pattern and a second pattern onto a second substrate held by the second substrate holder; and
    controlling the imaging of the second pattern onto the second substrate to reduce effects of differences between the two substrate holders.

13. A method as in claim 11, wherein controlling further comprises checking an identity of the substrate prior to the imaging of the second pattern.

14. A method as in claim 13, wherein the identity is used to determine upon which substrate holder the substrate has been previously imaged.

15. A method as in claim 14, wherein after determining, the imaging further comprises one of:
    placing the substrate onto the substrate holder upon which it has been previously imaged; and
    adjusting the imaging to account for differences between the first and second substrate holders.

16. A method as in claim 13, wherein the checking further comprises checking stored identity information.

17. A method as in claim 13, wherein the checking further comprises determining upon which of the two substrate holders the substrate was previously processed and processing the substrate on that substrate holder.

18. A method according to claim 17, wherein determining upon which of the two substrate holders the substrate was previously processed comprises:
    imaging at least a pair of alignment marks on an area of the substrate not comprising patterns of a microcircuit, the pair of alignment marks being spaced from each other by a distance, the distance corresponding to a particular one of the plurality of substrate holders;
    during a subsequent imaging process, measuring the distance; and
    correlating the distance to the particular substrate holder of the plurality of substrate holders.

19. A method as in claim 13, wherein checking further comprises checking a physical identification marker on the substrate.

20. A method as in claim 19, wherein the physical identification marker comprises at least one of a bar code, alphanumeric characters, one or more symbols, and combinations thereof.

21. A method as in claim 19, wherein the physical identification marker comprises a pair of alignment marks having a predetermined spacing.

22. A method as in claim 11, wherein ensuring further comprises ordering a batch of substrates to be processed such that each substrate is, in turn, associated with a respective one of the substrate holders on which it has previously has been processed.

23. A method as in claim 11, wherein controlling further comprises imaging the second pattern onto the substrate while the substrate is held on the second substrate holder and adjusting the imaging to account for differences between the first and second substrate holder.

24. A method as in claim 23, wherein adjusting is preformed on the basis of a set of stored parameters characterizing differences between the first and second substrate holders.

25. A device manufactured according to the method of claim 11.

* * * * *